United States Patent
Toratani et al.

(10) Patent No.: US 8,071,483 B2
(45) Date of Patent: Dec. 6, 2011

(54) SEMICONDUCTOR DEVICE MANUFACTURING METHOD AND SEMICONDUCTOR DEVICE MANUFACTURING APPARATUS

(75) Inventors: Kenichiro Toratani, Kanagawa-ken (JP); Takashi Nakao, Kanagawa-ken (JP); Ichiro Mizushima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/564,594

(22) Filed: Sep. 22, 2009

(65) Prior Publication Data

US 2010/0112822 A1 May 6, 2010

(30) Foreign Application Priority Data

Oct. 31, 2008 (JP) .................................. 2008-281332

(51) Int. Cl.
*H01L 21/302* (2006.01)
*H01L 21/461* (2006.01)

(52) U.S. Cl. ... 438/706; 438/513; 438/905; 257/E21.17; 257/E21.218; 257/E21.227; 257/E21.229; 257/E21.245; 257/E21.253; 257/E21.278; 257/E21.292

(58) Field of Classification Search .................. 438/513, 438/514, 680, 706, 723, 724, 753, 905; 257/E21.17, 257/218, 227, 245, 229, 253, 278, 292
See application file for complete search history.

(56) References Cited

U.S. PATENT DOCUMENTS

| 6,772,045 B2 | 8/2004 | Katsui et al. |
| 6,903,025 B2 | 6/2005 | Mizushima |
| 7,610,794 B2 * | 11/2009 | Yamaguchi et al. ......... 73/31.05 |
| 2007/0044579 A1 * | 3/2007 | Yamaguchi et al. ......... 73/865.5 |
| 2007/0212263 A1 * | 9/2007 | Shin et al. ........................ 422/95 |
| 2009/0026509 A1 * | 1/2009 | Hayashi et al. ............... 257/292 |

FOREIGN PATENT DOCUMENTS

JP 2003-77838 3/2003

* cited by examiner

*Primary Examiner* — David Nhu
(74) *Attorney, Agent, or Firm* — Finnegan, Henderson, Farabow, Garrett & Dunner, L.L.P.

(57) ABSTRACT

In a manufacturing process of a semiconductor device by forming a structure film on a substrate in a reaction chamber of a manufacturing apparatus, cleaning inside the reaction chamber is performed. That is, a precoat film made of a silicon nitride film containing boron is deposited on an inner wall of the reaction chamber, a silicon nitride film not containing boron is formed as the structure film on the substrate in the reaction chamber, and the inner wall of the reaction chamber is dry etched to be cleaned. At this time, the dry etching is terminated after boron is detected in a gas exhausted from the reaction chamber.

10 Claims, 11 Drawing Sheets

SEMICONDUCTOR DEVICE MANUFACTURING METHOD AND SEMICONDUCTOR DEVICE MANUFACTURING APPARATUS

CROSS-REFERENCE TO RELATED APPLICATIONS

This application is based upon and claims the benefit of priority from the prior Japanese Patent Application No. 2008-281332, filed on Oct. 31, 2008; the entire contents of which are incorporated herein by reference.

BACKGROUND OF THE INVENTION

1. Field of the Invention

This invention relates to a semiconductor device manufacturing method and a semiconductor device manufacturing apparatus for manufacturing a semiconductor device by forming a structure film on a substrate in a reaction chamber.

2. Background Art

In a semiconductor device manufacturing apparatus for manufacturing a semiconductor device by forming a dielectric film, conductive film, or other structure film on a wafer, such as an LP-CVD (low pressure chemical vapor deposition) or other film formation apparatus, its use results in deposition of the film formation material on the inner wall of the reaction chamber. When such a deposition film becomes too thick, the deposition film peels off and causes contamination in the reaction chamber, and the condition in the reaction chamber becomes nonuniform by local peeling of the deposition film. This causes the problem of nonuniformity in the thickness and quality of the structure film formed on the wafer.

Thus, for continued use of the film formation apparatus, during intervals between the intended uses for forming a structure film on a wafer, dry etching is regularly performed inside the reaction chamber to remove the deposition film deposited on the inner wall of the reaction chamber (see, e.g., JP-A-2003-077838(Kokai)). For instance, a monitoring wafer is placed in the reaction chamber, and dry etching is performed when the thickness of the deposition film deposited on this monitoring wafer reaches a reference value or more. In this dry etching, a halogen-based cleaning gas, such as HF gas and $F_2$ gas, is used.

However, in this dry etching, accurate endpoint determination is difficult, and conventionally, the etching time is empirically determined. Thus, as the case may be, the deposition film is left on the inner wall of the reaction chamber due to underetching, or conversely, the reaction chamber is damaged due to overetching. The deposition film left on the inner wall peels off and causes contamination in the reaction chamber, and the condition in the reaction chamber becomes nonuniform, thereby decreasing the yield of the semiconductor device. On the other hand, damage to the reaction chamber results in increasing the replacement frequency of components of the film formation apparatus. Thus, in either case, the productivity of the semiconductor device is decreased.

SUMMARY OF THE INVENTION

According to an aspect of the invention, there is provided a semiconductor device manufacturing method for forming a structure film on a substrate in a reaction chamber, the method including: depositing a precoat film on an inner wall of the reaction chamber, the precoat film containing a detection element which is not contained in the structure film; forming the structure film on the substrate; and dry etching the inner wall of the reaction chamber, the dry etching being terminated after the detection element is detected in a gas exhausted from the reaction chamber.

According to another aspect of the invention, there is provided a semiconductor device manufacturing method for forming a structure film on a substrate in a reaction chamber, the method including: depositing a precoat film on an inner wall of the reaction chamber, the precoat film containing an element contained in the structure film and having a different etching rate from the structure film; forming the structure film on the substrate; and dry etching the inner wall of the reaction chamber, the dry etching being terminated after detected amount of the element contained in a gas exhausted from the reaction chamber is varied from the detected amount corresponding to the structure film.

According to still another aspect of the invention, there is provided a semiconductor device manufacturing method for forming a structure film on a substrate in a reaction chamber, the method including: forming the structure film on the substrate; and dry etching the inner wall of the reaction chamber, the inner wall of the reaction chamber containing a detection element which is not contained in the structure film, and the dry etching being terminated after the detection element is detected in a gas exhausted from the reaction chamber.

According to still another aspect of the invention, there is provided a semiconductor device manufacturing apparatus for forming a structure film on a substrate, the apparatus including: a reaction chamber; a material gas introduction pipe for introducing a material gas of the structure film into the reaction chamber; a cleaning gas introduction pipe for introducing a cleaning gas into the reaction chamber; a detection gas introduction pipe for introducing into the reaction chamber a gas containing a detection element which is not contained in the structure film; and a detector for detecting the detection element contained in a gas exhausted from the reaction chamber.

According to still another aspect of the invention, there is provided a semiconductor device manufacturing apparatus for forming a structure film on a substrate, the apparatus including: a reaction chamber; a material gas introduction pipe for introducing a material gas of the structure film into the reaction chamber; a cleaning gas introduction pipe for introducing a cleaning gas into the reaction chamber; and a measurement device for measuring content of an element contained in the structure film of a gas exhausted from the reaction chamber.

According to still another aspect of the invention, there is provided a semiconductor device manufacturing apparatus for forming a structure film on a substrate, the apparatus including: a reaction chamber having an inner wall containing a detection element which is not contained in the structure film; a material gas introduction pipe for introducing a material gas of the structure film into the reaction chamber; a cleaning gas introduction pipe for introducing a cleaning gas into the reaction chamber; and a detector for detecting the detection element contained in a gas exhausted from the reaction chamber.

DETAILED DESCRIPTION OF THE INVENTION

Embodiments of the invention will now be described with reference to the drawings.

At the outset, a first embodiment of the invention is described.

Figure 1:
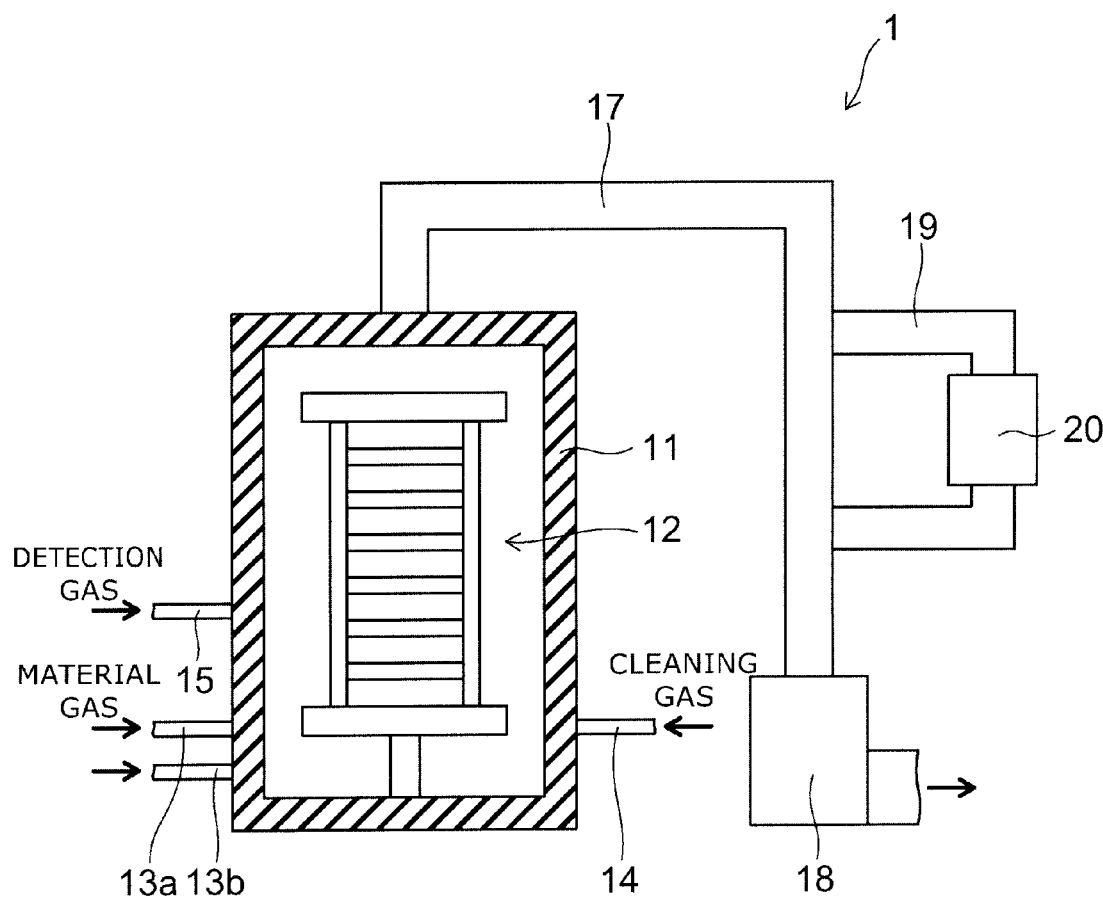
FIG. 1 is a schematic view illustrating a semiconductor device manufacturing apparatus according to a first embodiment of the invention.

FIG. 1 is a schematic view illustrating a semiconductor device manufacturing apparatus according to this embodiment.

The semiconductor device manufacturing apparatus according to this embodiment is an apparatus for manufacturing a semiconductor device, such as an LSI (large-scale integrated circuit) chip. More specifically, it is a film formation apparatus, such as an LPCVD apparatus, for forming a structure film on a substrate, such as a silicon wafer. Here, the structure film is a film which needs to be formed on the substrate in order to manufacture a semiconductor device, and includes a conductive film constituting an electrode and the like, a dielectric film constituting an interlayer film and the like, and a semiconductor film constituting an active area and the like. Besides these films constituting a semiconductor device, the structure film also includes films required in processing, such as a sacrificial film, mask film, etching stopper film, and diffusion prevention film. The structure film is illustratively a silicon nitride film, silicon oxide film, silicon film and the like.

As shown in FIG. 1, the semiconductor device manufacturing apparatus 1 according to this embodiment includes a reaction chamber 11 for forming a thin film on a substrate, such as a silicon wafer, illustratively by the LPCVD method. In the reaction chamber 11 is provided a wafer boat 12 or other jig for holding silicon wafers. The inner wall of the reaction chamber 11 and the wafer boat 12 or other jig are formed from quartz ($SiO_2$).

To the reaction chamber 11 are connected material gas introduction pipes 13a and 13b for introducing material gases for forming a structure film into the reaction chamber 11. For instance, in the case where the structure film is a silicon nitride film ($Si_3N_4$), the material gases are DCS (dichlorosilane, $SiCl_2H_2$) gas and ammonia ($NH_3$) gas. DCS gas is introduced into the reaction chamber 11 through the material gas introduction pipe 13a, and ammonia gas is introduced into the reaction chamber 11 through the material gas introduction pipe 13b. In the case where the material gas includes three or more gases, three or more material gas introduction pipes can be provided. Alternatively, a plurality of gases can be introduced by a single material gas introduction pipe. Furthermore, to the reaction chamber 11 is connected a cleaning gas introduction pipe 14 for introducing a cleaning gas into the reaction chamber 11. The cleaning gas is illustratively a mixed gas of hydrogen fluoride gas (HF) and fluorine gas ($F_2$).

Furthermore, to the reaction chamber 11 is connected a detection gas introduction pipe 15 for introducing a detection gas into the reaction chamber 11. The detection gas is a gas containing an element (hereinafter referred to as "detection element") which is not contained in the structure film, and is illustratively a material gas for forming a precoat film containing the detection element on the surface of the inner wall of the reaction chamber 11 and the wafer boat 12 or other jig (hereinafter also referred to as "inner wall and the like"). In this embodiment, the detection element is boron (B), the precoat film is a boron-containing silicon nitride film (hereinafter also referred to as "B—SiN film"), and the detection gas is $BCl_3$ gas.

Moreover, to the reaction chamber 11 is connected one end of an exhaust pipe 17. The other end of the exhaust pipe 17 is connected to an exhaust pump 18. Furthermore, both ends of an extraction pipe 19 are connected to a midpoint of the exhaust pipe 17, and a quadrupole mass spectrometer (Q-mass) 20 is attached to the extraction pipe 19 as a detector for detecting the detection element (boron).

Next, a description is given of the operation of the manufacturing apparatus according to this embodiment configured as described above, that is, a semiconductor device manufacturing method according to this embodiment.

Figure 2:
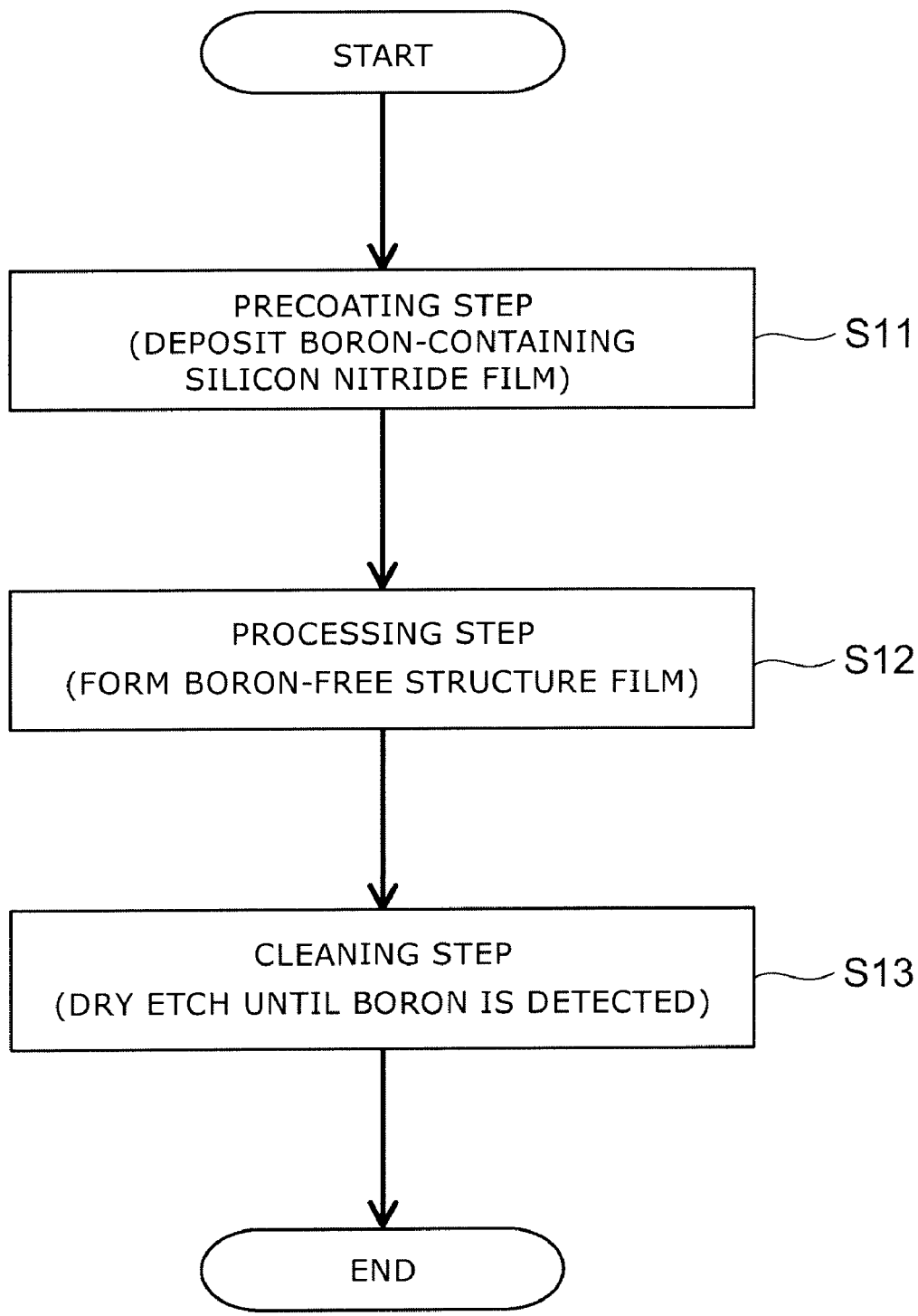
FIG. 2 is a flow chart illustrating a semiconductor device manufacturing method according to the first embodiment.

FIG. 2 is a flow chart illustrating the semiconductor device manufacturing method according to this embodiment.

Figure 3:
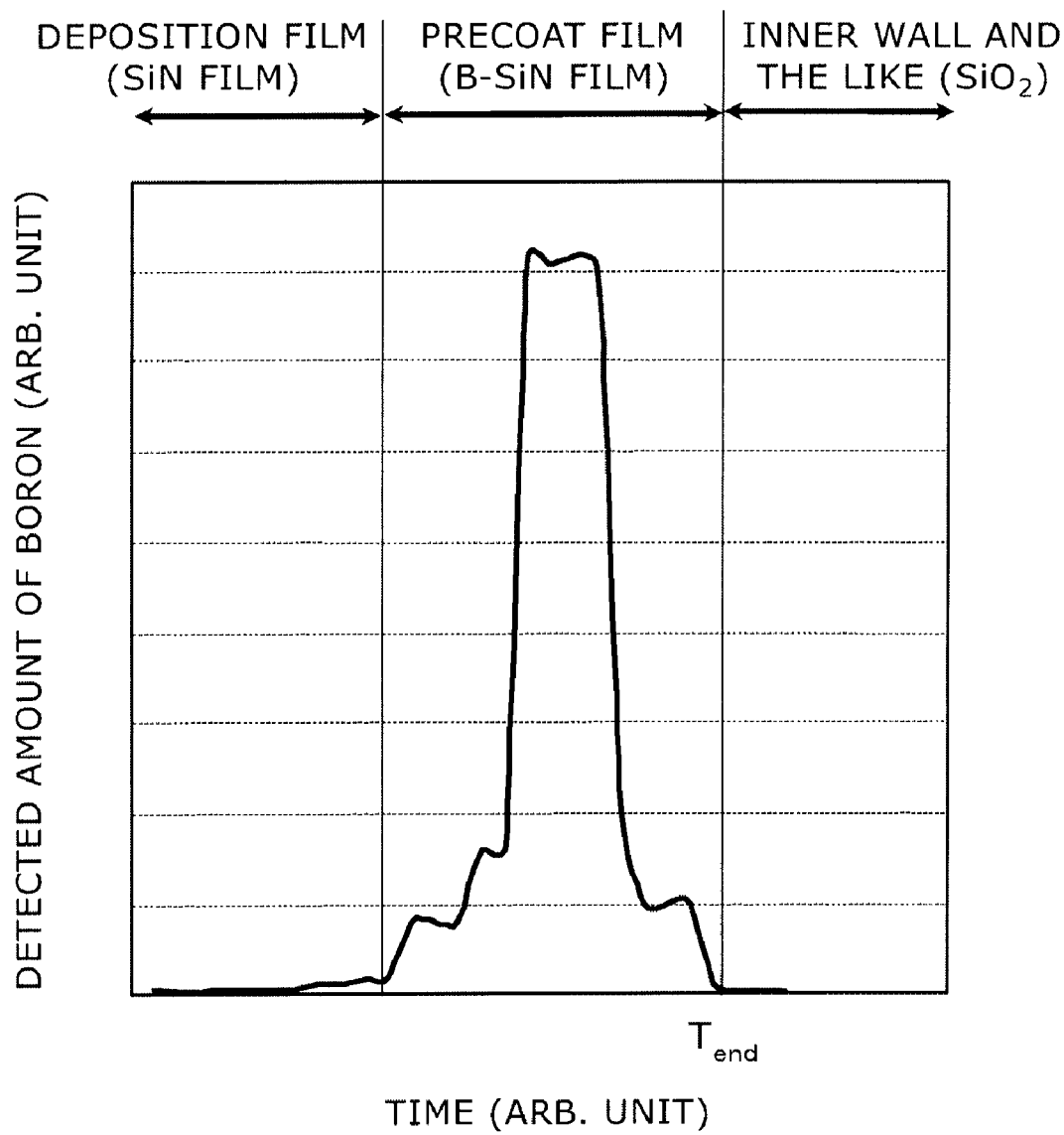
FIG. 3 is a graph illustrating a method for determining the endpoint of a cleaning step in the first embodiment.

FIG. 3 is a graph illustrating a method for determining the endpoint of a cleaning step in this embodiment, where the horizontal axis represents time, and the vertical axis represents the detected amount of boron.

First, as shown in FIG. 1 and step S11 of FIG. 2, a precoating step is performed on the manufacturing apparatus 1 with no deposition film deposited on the inner wall and the like of the reaction chamber 11, illustratively the manufacturing apparatus 1 which is new or just cleaned. Specifically, into the reaction chamber 11, material gases are introduced through the material gas introduction pipes 13a and 13b, and a detection gas is introduced through the detection gas introduction pipe 15. Thus, a precoat film containing the detection element is deposited on the surface of the inner wall of the reaction chamber 11 and the wafer boat 12 or other jig. For instance, into the reaction chamber 11, DCS gas is introduced through the material gas introduction pipe 13a, ammonia gas is introduced through the material gas introduction pipe 13b, $BCl_3$ gas is introduced through the detection gas introduction pipe 15, and these are reacted in the reaction chamber 11. Thus, a boron-containing silicon nitride film (B—SiN film) is deposited as a precoat film on the surface of the inner wall and the like of the reaction chamber 11. Here, depending on the type of the precoat film, the precoat film can be deposited using only the detection gas without supplying material gases.

Next, as shown in step S12 of FIG. 2, a processing step is performed. More specifically, material gases are introduced into the reaction chamber 11 through the material gas introduction pipes 13a and 13b to form a structure film on a substrate. This structure film is free from the aforementioned detection element. For instance, DCS gas and ammonia gas are introduced as material gases and reacted in the reaction chamber 11 to form a silicon nitride film substantially free from boron (hereinafter also referred to as "SiN film") as a structure film on a silicon wafer. The silicon wafer with the structure film thus formed thereon is subsequently subjected to film formation, etching and other processing by other manufacturing apparatuses, and diced into semiconductor devices.

In this processing step, the film formation material of the structure film is deposited also on the surface of the inner wall of the reaction chamber 11 and the wafer boat 12 or other jig, inevitably forming a deposition film. The deposition film is a lamination of the film formation material of the structure film, free from the detection element (boron). Subsequently, the substrate, or the silicon wafer, is replaced, and formation of the structure film is repeated. Thus, the deposition film deposited on the inner wall and the like of the reaction chamber 11 is gradually thickened.

When the deposition film reaches a certain thickness, as shown in step S13 of FIG. 2, a cleaning step is performed. The timing of performing the cleaning step can be the time when the deposition film deposited on the monitoring wafer placed in the reaction chamber 11 reaches a certain thickness, or the time when the duration of performing the processing step reaches a certain duration.

In the cleaning step, a cleaning gas is introduced into the reaction chamber 11 through the cleaning gas introduction pipe 14, and the inner wall and the like of the reaction chamber 11 is dry etched. The cleaning gas is illustratively a mixed gas of hydrogen fluoride gas (HF) and fluorine gas ($F_2$). Furthermore, the exhaust pump 18 is operated to exhaust the gas in the reaction chamber 11 through the exhaust pipe 17. At this time, part of the exhaust gas is extracted into the extraction pipe 19, and the content of boron in the exhaust gas is measured by the quadrupole mass spectrometer 20.

Here, as shown in FIG. 3, for a while from the start of dry etching, the deposition film deposited on the inner wall and the like of the reaction chamber 11, such as the boron-free silicon nitride film (SiN film), is etched, and hence no boron is detected by the quadrupole mass spectrometer 20. However, when the deposition film is locally removed, and the precoat film, or the boron-containing silicon nitride film (B—SiN film), is exposed and starts to be etched, boron starts to be mixed in the exhaust gas, and the quadrupole mass spectrometer 20 starts to detect boron. Then, when the exposed area of the precoat film increases with the removal of the deposition film, the detected amount of boron also increases. Subsequently, when the precoat film is locally removed, and quartz ($SiO_2$) constituting the inner wall and the like of the reaction chamber starts to be exposed, the detected amount of boron decreases. Then, when the precoat film is completely removed, boron ceases to be detected.

Hence, the time when boron starts to be detected can be determined as the time when the deposition film is partly removed and the precoat film starts to be exposed, and the time when boron ceases to be detected can be determined as the time when the precoat film is removed almost completely. It is considered that at the time when the precoat film starts to be exposed, the deposition film still partly remains, and that at the time when the precoat film is completely removed, the deposition film is also removed almost completely. On the other hand, if dry etching is further continued after the removal of the precoat film, the inner wall and the like of the reaction chamber 11 is etched and damaged.

Thus, in this embodiment, dry etching is terminated during the interval from the time when boron starts to be detected by the quadrupole mass spectrometer 20 to the time when boron ceases to be detected. For instance, dry etching is terminated at the time $T_{end}$ when the detected amount of boron has passed a peak and decreased to nearly zero. Thus, the deposition film and the precoat film are removed from the surface of the inner wall and the like of the reaction chamber 11, and the reaction chamber 11 returns to the state before the precoating step.

Subsequently, this cycle is repeated. More specifically, as shown in step S11, a precoat film is deposited on the inner wall and the like of the reaction chamber 11. Then, in step S12, a structure film is formed on a substrate to manufacture a semiconductor device. When the deposition film attached to the inner wall and the like of the reaction chamber 11 is thickened, cleaning is performed as shown in step S13.

Next, the effect of this embodiment is described.

As described above, according to this embodiment, in advance of forming a structure film, a precoat film containing the detection element (such as boron) is deposited on the inner wall and the like of the reaction chamber 11. At the time of cleaning, dry etching is performed while detecting the detection element in the exhaust gas. This serves to ascertain which film is currently etched during cleaning, and to accurately determine the endpoint of dry etching. Hence, the deposition film can be effectively removed while preventing damage to the inner wall and the like of the reaction chamber 11. Consequently, there are no cases where the deposition film becomes too thick and peels off, causing contamination in the reaction chamber 11 or making nonuniform the condition in the reaction chamber 11.

Furthermore, there is no increase in the replacement frequency of components due to damage to the inner wall and the like of the reaction chamber 11. Thus, the semiconductor device can be manufactured with high productivity. In this embodiment as illustrated, a silicon nitride film is formed as a structure film, and boron is used as a detection element. However, the invention is not limited thereto. For instance, the structure film formed can be any other film, such as a silicon oxide film and polysilicon film, and various films with different compositions can be laminated. Furthermore, the detection element is also not limited to boron, but can be any element which is not contained in the structure film and does not interfere with the processing step. For instance, such elements as phosphorus (P) and arsenic (As) can be used. If the detection element is phosphorus or arsenic, and the precoat film is a silicon nitride film containing phosphorus or arsenic, then phosphine ($PH_3$) or arsine ($AsH_4$), respectively, can be used as a detection gas, or a material gas for adding phosphorus or arsenic to the precoat film. Furthermore, it is also possible to form the precoat film from alumina ($Al_2O_3$) and use aluminum (Al) as a detection element. In this case, TMA (trimethylaluminum, $(CH_3)_3Al$) can be used as a detection gas. Furthermore, the detector is not limited to the quadrupole mass spectrometer as long as it can detect the presence or absence of the detection element.

Next, a variation of this embodiment is described.

Figure 4:
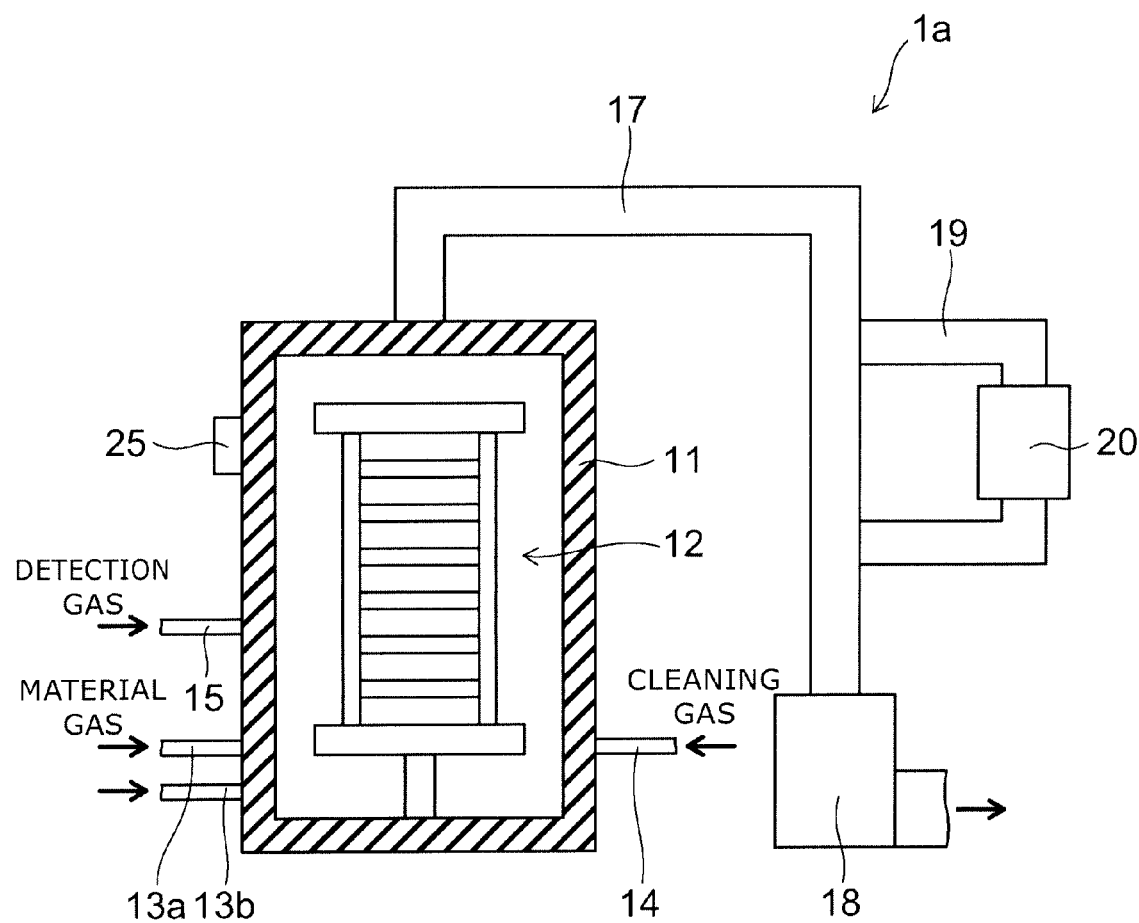
FIG. 4 is a schematic view illustrating a semiconductor device manufacturing apparatus according to a variation of the first embodiment.

FIG. 4 is a schematic view illustrating a semiconductor device manufacturing apparatus according to this variation.

As shown in FIG. 4, the semiconductor device manufacturing apparatus 1a according to this variation includes a temperature measurement device 25 for measuring the temperature of the inner wall of the reaction chamber 11 in addition to the configuration of the semiconductor device manufacturing apparatus 1 (see FIG. 1) according to the above first embodiment. Furthermore, the cleaning step shown in step S13 of FIG. 2 determines the time to terminate dry etching by considering the temperature of the inner wall of the reaction chamber 11 as well as the presence or absence of boron in the exhaust gas. Specifically, the temperature of the inner wall of the reaction chamber 11 is higher when the B—SiN film is etched than when the SiN film is etched and when quartz is etched. Hence, by continuously measuring the temperature of the inner wall using the temperature measurement device 25, it is possible to ascertain the timing when the B—SiN film is etched. That is, dry etching can be stopped after the temperature of the inner wall is increased. Thus, the endpoint of dry etching can be determined more accurately by performing both boron detection and temperature measurement. The configuration of the manufacturing apparatus, the manufacturing method, and the effect of this variation other than the foregoing are the same as those of the above first embodiment.

Next, a second embodiment of the invention is described.

Figure 5:
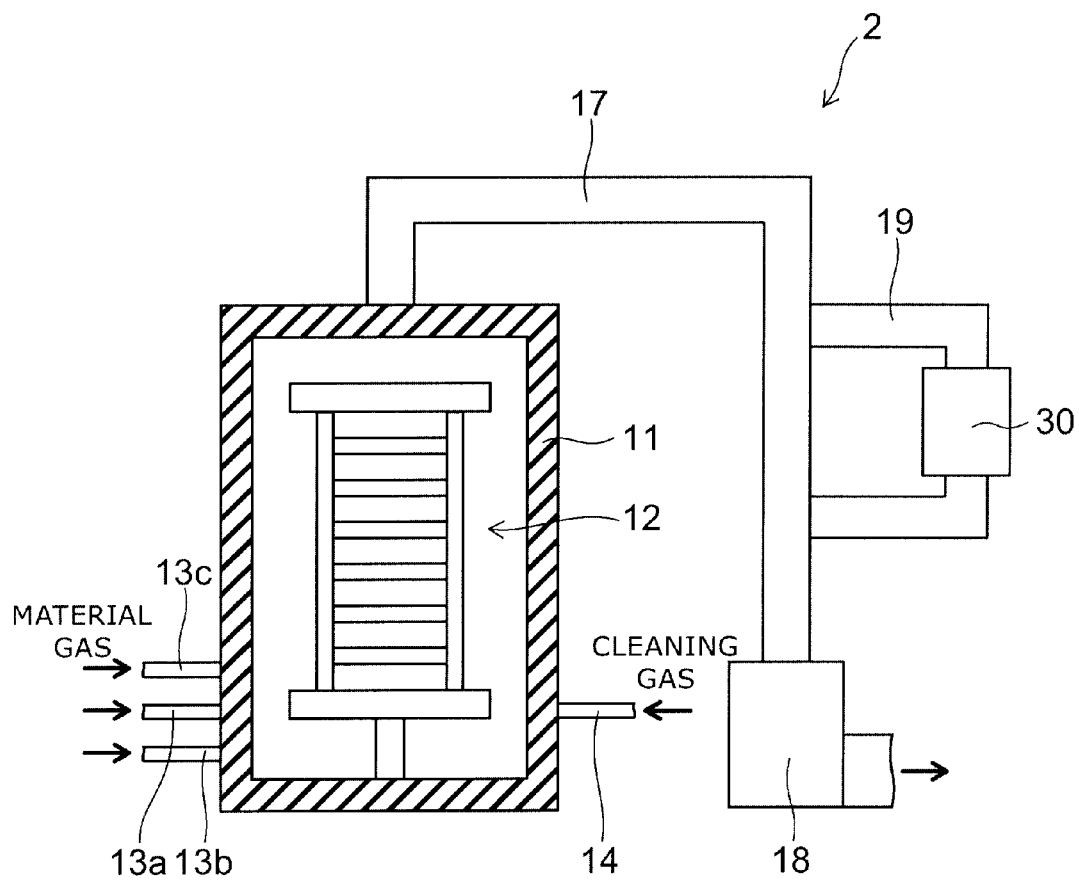
FIG. 5 is a schematic view illustrating a semiconductor device manufacturing apparatus according to a second embodiment of the invention.

FIG. 5 is a schematic view illustrating a semiconductor device manufacturing apparatus according to this embodiment.

In this embodiment, the precoat film and the structure film are both silicon nitride films (SiN films). However, a different film formation method is used for each film to provide it with a different etching rate. Then, in the cleaning step, the content of silicon element in the exhaust gas is measured to determine the endpoint of etching.

As shown in FIG. 5, the semiconductor device manufacturing apparatus 2 according to this embodiment is different from the manufacturing apparatus 1 (see FIG. 1) according to the above first embodiment in lacking the detection gas introduction pipe 15 (see FIG. 1) but including three material gas introduction pipes 13a, 13b, 13c. The material gas introduction pipe 13a is a pipe for introducing DCS gas into the reaction chamber 11, the material gas introduction pipe 13b is a pipe for introducing ammonia gas into the reaction chamber 11, and the material gas introduction pipe 13c is a pipe for introducing HCD (hexachlorodisilane, $Si_2Cl_6$) gas into the reaction chamber 11.

Furthermore, the manufacturing apparatus 2 includes an infrared detector 30 as a measurement device instead of the quadrupole mass spectrometer 20 (see FIG. 1). The infrared detector 30 measures the gas exhausted from the reaction chamber 11 for the content of elements contained in the structure film by measuring the $SiF_4$ concentration in the exhaust gas. The configuration of the manufacturing apparatus other than the foregoing is the same as that of the manufacturing apparatus 1 (see FIG. 1).

Next, a description is given of the operation of the manufacturing apparatus according to this embodiment configured as described above, that is, a semiconductor device manufacturing method according to this embodiment.

Figure 6:
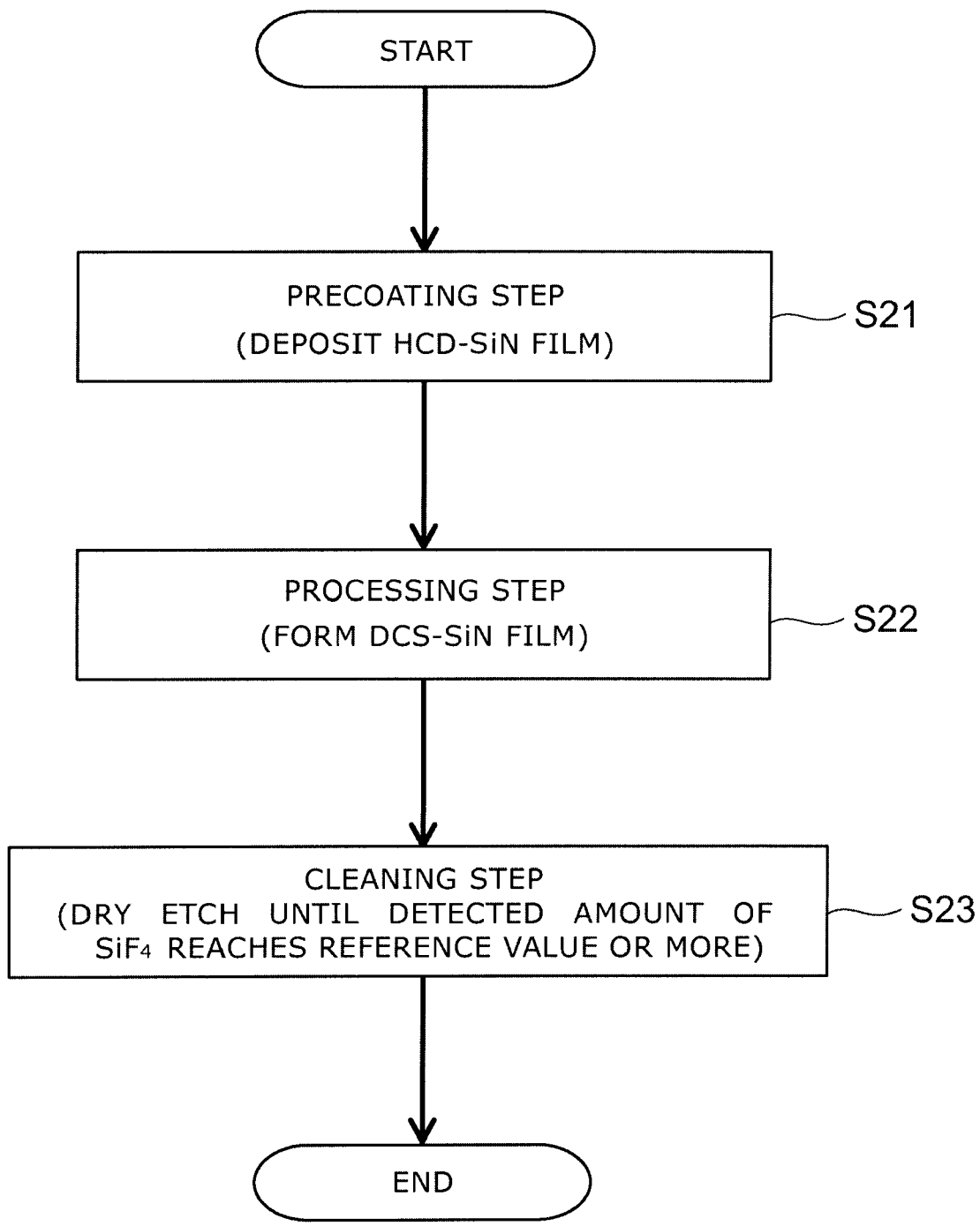
FIG. 6 is a flow chart illustrating a semiconductor device manufacturing method according to the second embodiment.

FIG. 6 is a flow chart illustrating the semiconductor device manufacturing method according to this embodiment.

Figure 7:
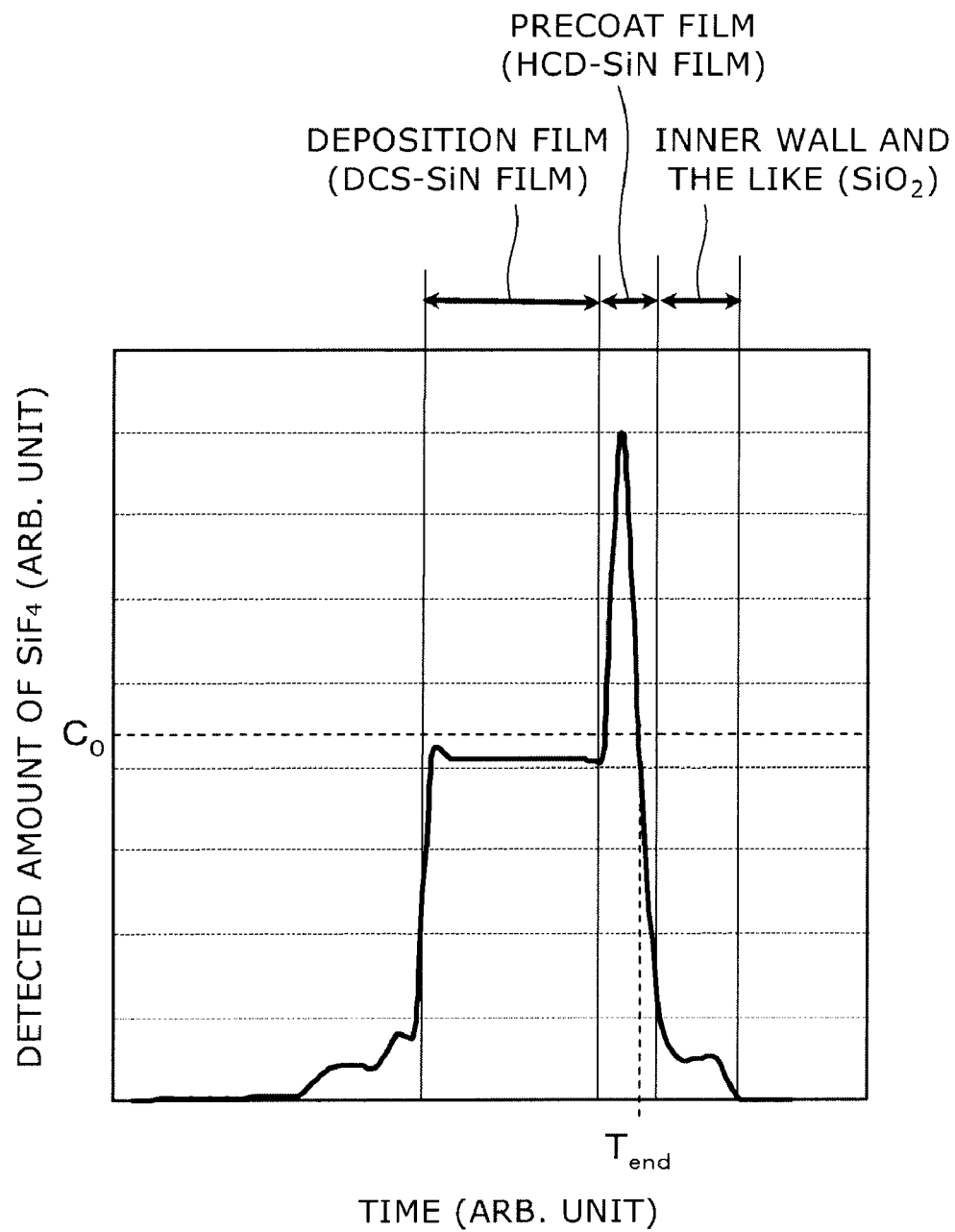
FIG. 7 is a graph illustrating a method for determining the endpoint of a cleaning step in the second embodiment.

FIG. 7 is a graph illustrating a method for determining the endpoint of a cleaning step in this embodiment, where the horizontal axis represents time, and the vertical axis represents the detected amount of $SiF_4$.

First, as shown in FIG. 5 and step S21 of FIG. 6, a precoating step is performed on the manufacturing apparatus 2 with no deposition film deposited on the inner wall and the like of the reaction chamber 11. Here, a precoat film containing the element contained in the structure film and having a higher etching rate than the structure film is deposited on the inner wall and the like of the reaction chamber 11. For instance, into the reaction chamber 11, HCD gas is introduced through the material gas introduction pipe 13c, and ammonia gas is introduced through the material gas introduction pipe 13b. Thus, HCD reacts with ammonia inside the reaction chamber 11, and a silicon nitride film is deposited as a precoat film on the surface of the inner wall of the reaction chamber 11 and the wafer boat 12 or other jig. This silicon nitride film resulting from HCD is hereinafter referred to as "HCD-SiN film".

Next, as shown in step S22 of FIG. 6, a processing step is performed. More specifically, material gases are introduced into the reaction chamber 11 through the material gas introduction pipes 13 to form a structure film on a substrate. For instance, into the reaction chamber 11, DCS gas is introduced through the material gas introduction pipe 13a, ammonia gas is introduced through the material gas introduction pipe 13b, and these are reacted in the reaction chamber 11 to form a silicon nitride film as a structure film on a silicon wafer. This silicon nitride film resulting from DCS is hereinafter referred to as "DCS-SiN film". Subsequently, the substrate, or the silicon wafer, is replaced, and formation of the structure film is repeated. Thus, the deposition film deposited on the inner wall and the like of the reaction chamber 11 is gradually thickened.

As compared with the DCS-SiN film formed as a structure film in step S22, the HCD-SiN film deposited as a precoat film in step S21 has a similar composition but a less film density, and hence a higher etching rate.

When the deposition film reaches a certain thickness, as shown in step S23 of FIG. 6, a cleaning step is performed. The contents of the cleaning step are the same as those in the above first embodiment. At this time, part of the exhaust gas is extracted into the infrared detector 30, and the concentration of $SiF_4$ in the exhaust gas is measured by the infrared detector 30 to measure the content of silicon element in the exhaust gas.

Here, as shown in FIG. 7, for a while from the start of dry etching, the deposition film deposited on the inner wall and the like of the reaction chamber 11, or the DCS-SiN film having a dense film structure and a relatively low etching rate, is etched, and hence the $SiF_4$ concentration in the exhaust gas is relatively low. However, when the deposition film is locally removed, and the precoat film, or the HCD-SiN film, is exposed and starts to be etched, the $SiF_4$ concentration in the exhaust gas increases because the HCD-SiN film has a less film density and higher etching rate than the DCS-SiN film. Then, when the exposed area of the precoat film increases with the removal of the deposition film, the $SiF_4$ concentration also increases. Subsequently, when the precoat film is locally removed, and quartz ($SiO_2$) constituting the inner wall and the like of the reaction chamber 11 starts to be exposed, the $SiF_4$ concentration in the exhaust gas decreases because quartz is more resistant to etching than the HCD-SiN film.

Hence, the time when the $SiF_4$ concentration starts to increase can be determined as the time when the deposition film is partly removed and the precoat film starts to be exposed, and the time when the $SiF_4$ concentration has passed a peak and starts to decrease can be determined as the time when the precoat film is partly removed and the inner wall and the like of the reaction chamber 11 is exposed and starts to be etched. It is considered that at the time when the precoat film starts to be exposed, the deposition film still partly remains, and that at the time when the inner wall and the like of the reaction chamber 11 start to be exposed, the deposition film is removed almost completely. On the other hand, if dry etching is further continued after the exposure of the inner wall and the like of the reaction chamber 11, the inner wall and the like is damaged.

Thus, in this embodiment, dry etching is terminated after the detected amount of Si element contained in the gas exhausted from the reaction chamber 11 is varied from the detected amount corresponding to the structure film. Specifically, dry etching is terminated after the detected amount of $SiF_4$ in the exhaust gas measured by the infrared detector 30 reaches a determination value $C_0$ or more. The determination value $C_0$ is defined as a value higher than the detected value of $SiF_4$ in the exhaust gas detected during etching the DCS-SiN film and lower than the detected value of $SiF_4$ in the exhaust gas detected during etching the HCD-SiN film. For instance, dry etching is terminated at the time $T_{end}$ when the concentration of $SiF_4$ has passed a peak and decreased back to the same level as before the peak, that is, becomes equal to the detected value during etching the DCS-SiN film. Thus, the deposition film and the precoat film are removed from the surface of the inner wall and the like of the reaction chamber 11. Subsequently, the cycle shown in steps S21-S23 is repeated.

Next, the effect of this embodiment is described.

As described above, according to this embodiment, in advance of forming a DCS-SiN film serving as a structure film, an HCD-SiN film is deposited on the inner wall and the like of the reaction chamber 11 as a precoat film containing the element (Si) contained in the structure film and having a higher etching rate than the structure film. In the cleaning step, dry etching is performed while measuring the amount of Si in the exhaust gas. This serves to accurately ascertain the progress of etching like the above first embodiment, and to accurately determine the endpoint of dry etching. Consequently, the deposition film can be effectively removed while preventing damage to the inner wall and the like of the reaction chamber 11. Thus, the productivity of the semiconductor device can be increased.

Furthermore, according to this embodiment, in contrast to the above first embodiment, there is no need to introduce boron into the reaction chamber 11. Hence, there is no need to provide a detection gas introduction pipe 15 (see FIG. 1) on the manufacturing apparatus, and there is no danger that the structure film is contaminated with boron, a heterogeneous material.

In this embodiment as illustrated, a DCS-SiN film is used as a structure film, and an HCD-SiN film is used as a precoat film. However, the invention is not limited thereto. For instance, the precoat film can be a film having a lower etching rate than the structure film. Also in this case, the content of a particular element in the exhaust gas can be continuously measured, and dry etching can be terminated after variation from the detected amount corresponding to the structure film. Furthermore, different etching rates can be obtained by varying the composition of the precoat film from the composition of the structure film. Furthermore, different etching rates can be obtained by using the same material gas for the structure film and the precoat film but using different film formation conditions to vary the film composition, crystal structure and the like. Moreover, the structure film can be a film other than the silicon nitride film, such as a silicon oxide film or polysilicon film. In this case, the precoat film can be any film containing the element contained in the structure film and having a different etching rate from the structure film.

Also in this embodiment, like the variation of the first embodiment described above, a temperature measurement device 25 (see FIG. 4) for measuring the temperature of the inner wall of the reaction chamber can be provided on the semiconductor device manufacturing apparatus, and in the cleaning step, the endpoint of dry etching can be determined by considering the temperature of the inner wall as well. During etching the HCD-SiN film, or the precoat film, the etching reaction proceeds faster, and hence the temperature of the inner wall of the reaction chamber is higher, than during etching the DCS-SiN film, or the structure film.

Next, a third embodiment of the invention is described.

Figure 8:
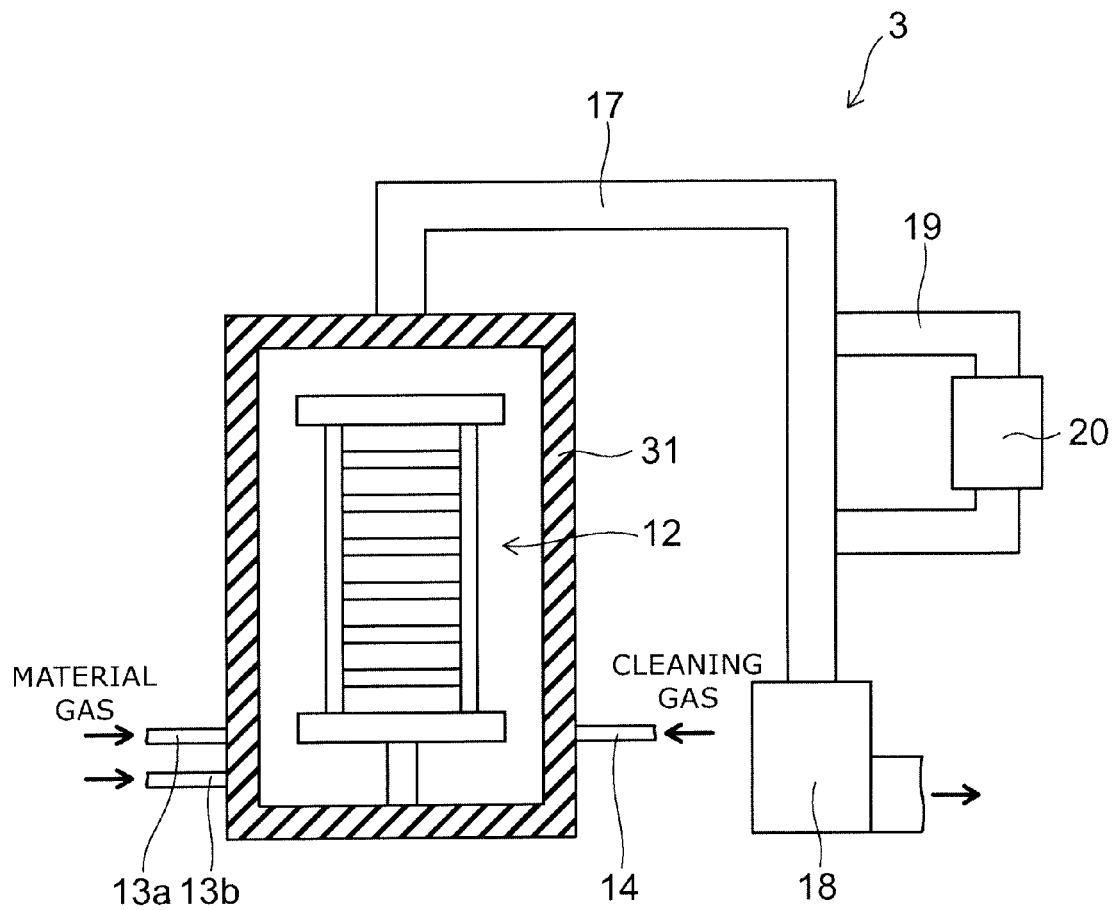
FIG. 8 is a schematic view illustrating a semiconductor device manufacturing apparatus according to a third embodiment of the invention.

FIG. 8 is a schematic view illustrating a semiconductor device manufacturing apparatus according to this embodiment.

As shown in FIG. 8, the semiconductor device manufacturing apparatus 3 according to this embodiment is different from the manufacturing apparatus 1 (see FIG. 1) according to the above first embodiment in that the reaction chamber 31 is formed from boron-containing quartz (B—$SiO_2$). Furthermore, the manufacturing apparatus 3 lacks the detection gas introduction pipe 15 (see FIG. 1). The configuration of the manufacturing apparatus 3 other than the foregoing is the same as that of the manufacturing apparatus 1 (see FIG. 1).

Next, a description is given of the operation of the manufacturing apparatus according to this embodiment configured as described above, that is, a semiconductor device manufacturing method according to this embodiment.

Figure 9:
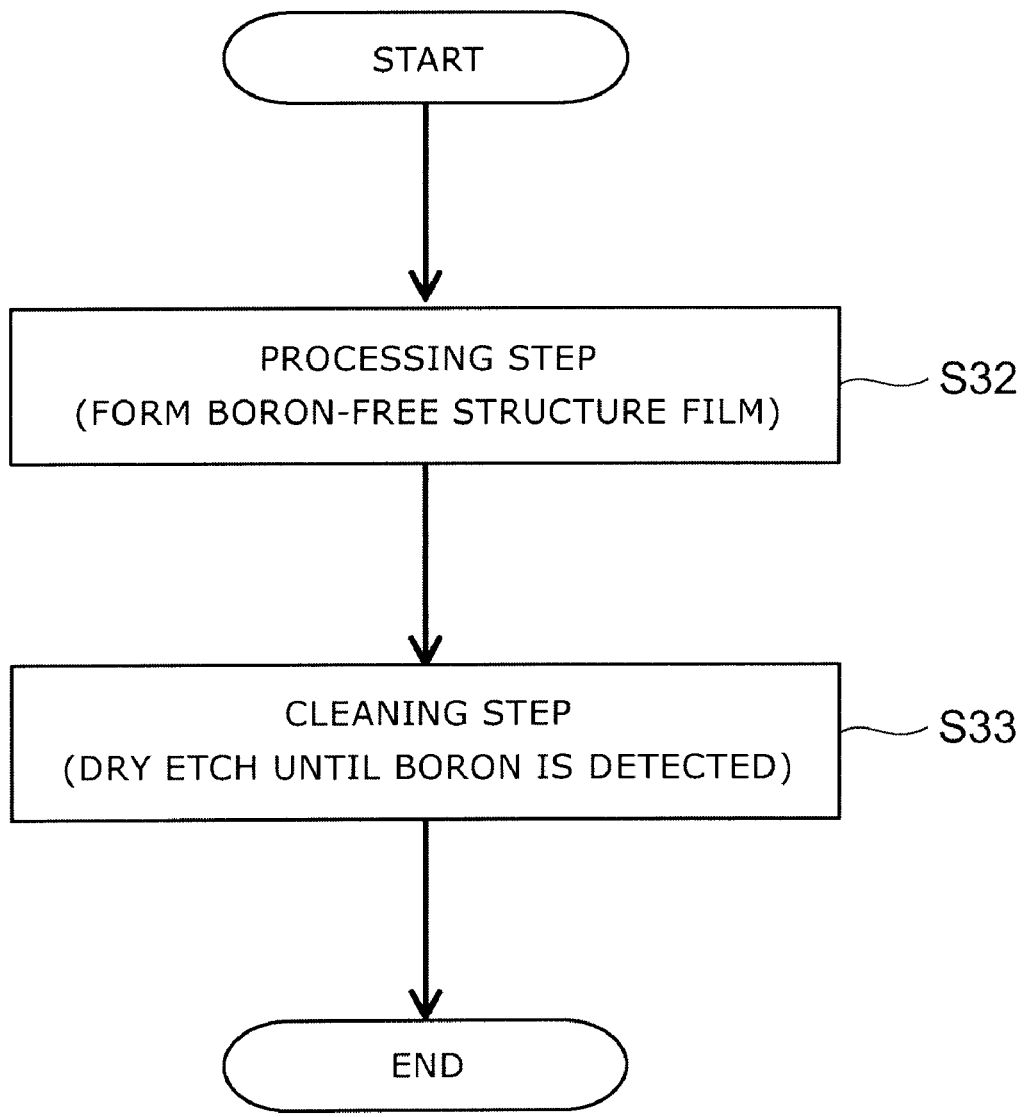
FIG. 9 is a flow chart illustrating a semiconductor device manufacturing method according to the third embodiment.

FIG. 9 is a flow chart illustrating the semiconductor device manufacturing method according to this embodiment.

As shown in FIG. 9, in this embodiment, the precoating step as performed in the above first and second embodiment is not performed. More specifically, without deposition of a precoat film, a processing step S32 is performed on the manufacturing apparatus 3 with no deposition film deposited on the inner wall and the like of the reaction chamber 31. The contents of the processing step S32 are the same as those of the processing step S12 in the above first embodiment. More specifically, a structure film free from the detection element boron, such as a silicon nitride film (SiN film), is formed on a substrate, such as a silicon wafer.

When the deposition film reaches a certain thickness, as shown in step S33 of FIG. 9, a cleaning step is performed. The contents of the cleaning step are the same as those in the above first embodiment. More specifically, while dry etching is performed in the reaction chamber 31 using a cleaning gas, part of the exhaust gas is extracted into the extraction pipe 19, and the content of boron in the exhaust gas is measured by the quadrupole mass spectrometer 20. Here, for a while from the start of dry etching, the deposition film deposited on the inner wall and the like of the reaction chamber 31, or the boron-free silicon nitride film (SiN film), is etched, and hence no boron is detected by the quadrupole mass spectrometer 20. However, when the deposition film is locally removed, and boron-containing quartz (B—$SiO_2$) constituting the reaction chamber 31 is exposed and etched, boron is mixed in the exhaust gas and detected by the quadrupole mass spectrometer 20. Here, if dry etching is further continued after the exposure of quartz, the inner wall and the like of the reaction chamber 31 is etched and damaged. Thus, in this embodiment, dry etching is terminated at a suitable time $T_{end}$ after the time when boron starts to be detected by the quadrupole mass spectrometer 20. Thus, the deposition film is removed from the surface of the inner wall and the like of the reaction chamber 31.

Next, the effect of this embodiment is described.

According to this embodiment, the inner wall of the reaction chamber 31 is formed from a material containing a detection element, such as boron-containing quartz. In the cleaning step, dry etching is performed while detecting the detection element in the exhaust gas. This facilitates determining the endpoint of dry etching. Thus, the deposition film can be effectively removed while preventing damage to the inner wall and the like of the reaction chamber 31. Consequently, the productivity of the semiconductor device can be increased.

Furthermore, in this embodiment, the detection element is previously contained in the inner wall of the reaction chamber 31. Hence, in contrast to the above first embodiment, there is no need to perform the precoating step. Hence, the need of time and cost required for the precoating step is eliminated, and the semiconductor device can be manufactured more efficiently.

In this embodiment, the wafer boat 12 or other jig placed in the reaction chamber 31 can also be formed from boron-containing quartz. Furthermore, in this embodiment, boron is illustratively used as a detection element, but the invention is not limited thereto. The detection element can be any element which is not contained in the structure film and does not interfere with the processing step. For instance, such elements as phosphorus (P) and arsenic (As) can be used. Furthermore, also in this embodiment, like the variation of the first embodiment described above, a temperature measurement device 25 (see FIG. 4) for measuring the temperature of the inner wall of the reaction chamber can be provided on the semiconductor device manufacturing apparatus, and in the cleaning step, the endpoint of dry etching can be determined by considering the temperature of the inner wall as well.

Next, a fourth embodiment of the invention is described.

Figure 10:
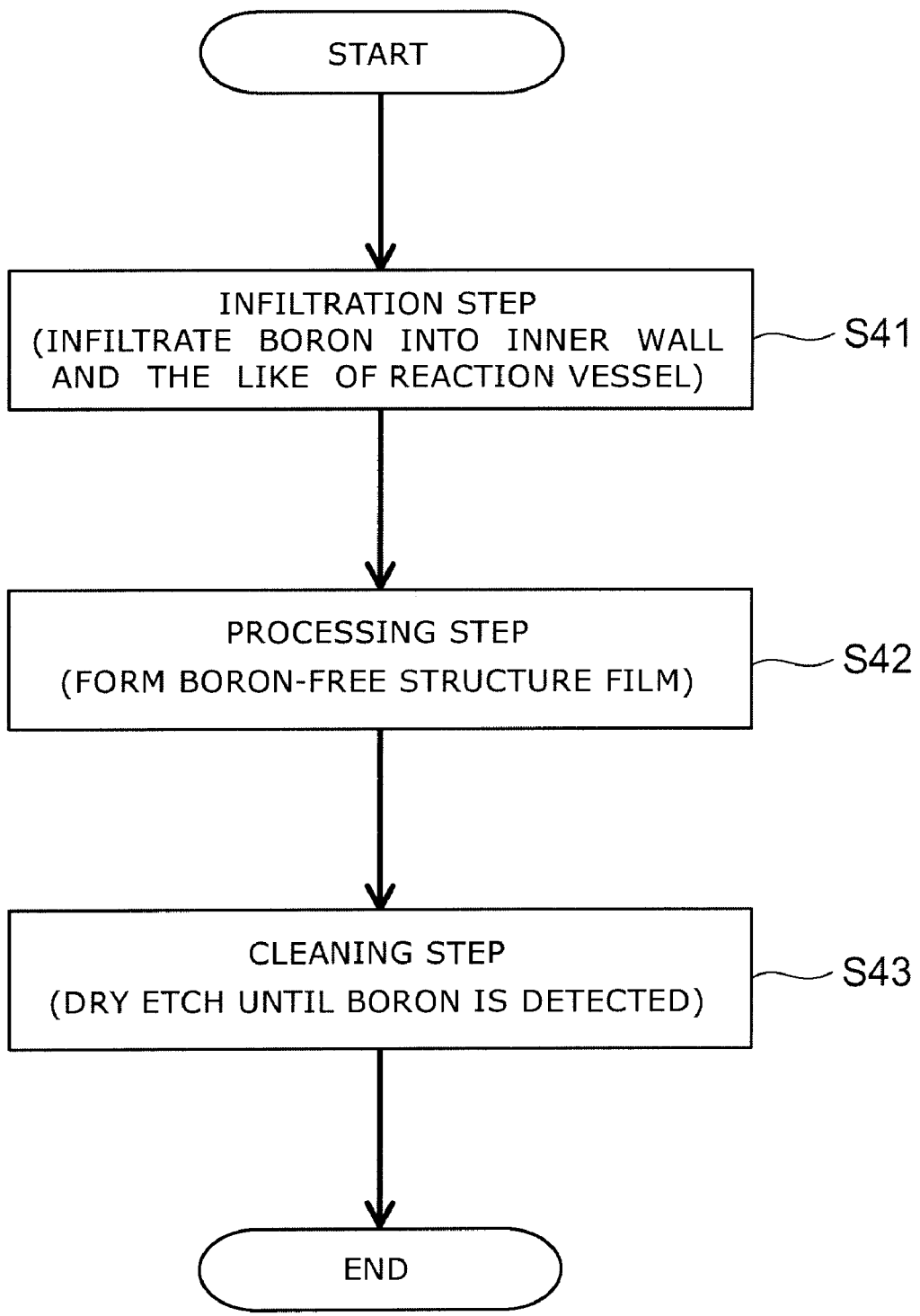
FIG. 10 is a flow chart illustrating a semiconductor device manufacturing method according to a fourth embodiment of the invention.

FIG. 10 is a flow chart illustrating the semiconductor device manufacturing method according to this embodiment.

Figure 11:
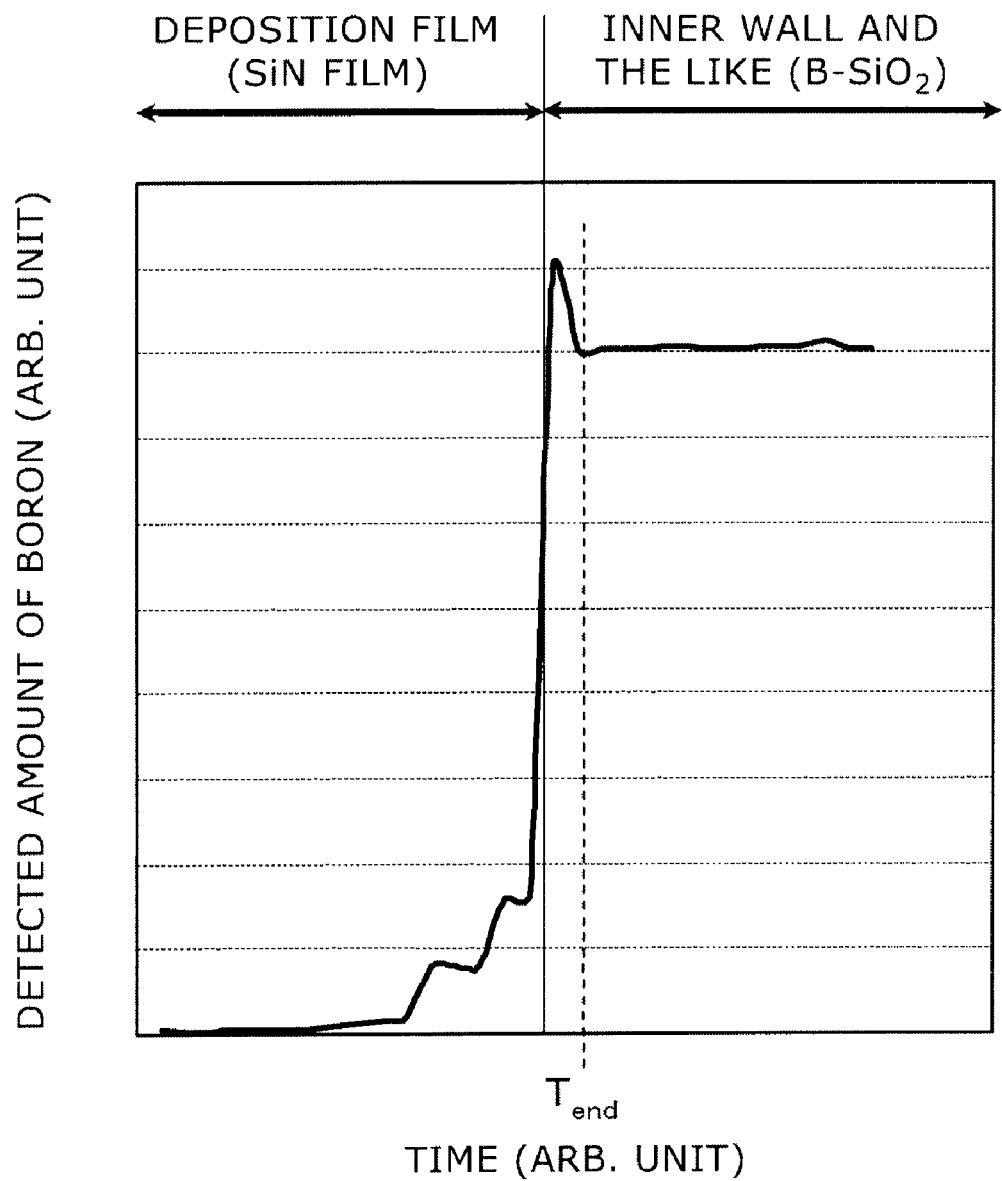
FIG. 11 is a graph illustrating a method for determining the endpoint of a cleaning step in the fourth embodiment.

FIG. 11 is a graph illustrating a method for determining the endpoint of a cleaning step in this embodiment, where the horizontal axis represents time, and the vertical axis represents the detected amount of boron.

In this embodiment, the semiconductor device manufacturing apparatus 1 (see FIG. 1) according to the above first embodiment is used as a semiconductor device manufacturing apparatus.

In this embodiment, the precoating step (see step S11 of FIG. 2) as performed in the above first embodiment is not performed. Instead, as shown in step S41 of FIG. 10, an infiltration step is performed to infiltrate the detection element into the superficial layer of the inner wall and the like of the reaction chamber 11 by filling the reaction chamber 11 with a gas containing the detection element. Specifically, BCl$_3$ gas is introduced into the reaction chamber 11 through the detection gas introduction pipe 15 to fill the reaction chamber 11. Thus, boron is diffused and infiltrated into the superficial layer of the inner wall of the reaction chamber 11 and the wafer boat 12 or other jig. Subsequently, BCl$_3$ gas is thoroughly exhausted from the reaction chamber 11.

Next, as shown in step S42, a processing step is performed. The contents of the processing step S42 are the same as those of the processing step S12 in the above first embodiment. More specifically, a structure film free from the detection element boron, such as a silicon nitride film (SiN film), is formed on a substrate, such as a silicon wafer.

When the deposition film reaches a certain thickness, as shown in step S43 of FIG. 10, a cleaning step is performed. The contents of the cleaning step are the same as those in the above first and third embodiment. Here, as shown in FIG. 11, while the boron-free deposition film deposited on the inner wall and the like of the reaction chamber 11 is etched, no boron is detected by the quadrupole mass spectrometer 20. However, when the deposition film is removed, and quartz (SiO$_2$) constituting the inner wall and the like of the reaction chamber 11 is exposed, boron is mixed in the etching exhaust gas and detected by the quadrupole mass spectrometer 20 because boron is infiltrated into the superficial layer of the inner wall and the like. The detected amount of boron is maximized when the superficial layer of the inner wall and the like is etched, and forms a peak as shown in FIG. 11.

In this embodiment, dry etching is terminated at a suitable time after the time when boron starts to be detected. For instance, dry etching is stopped at the time $T_{end}$ when the detected amount of boron has passed the peak in FIG. 11. Thus, the deposition film is removed from the surface of the inner wall and the like of the reaction chamber 11.

Next, the effect of this embodiment is described.

According to this embodiment, the detection element is infiltrated into the superficial layer of the inner wall and the like of the reaction chamber 11 in step S41. In the cleaning step, dry etching is performed while detecting the detection element in the exhaust gas. This facilitates determining the endpoint of dry etching. Consequently, the deposition film can be effectively removed while preventing damage to the inner wall and the like of the reaction chamber 11. Furthermore, boron can be infiltrated intensively into the superficial portion of the inner wall and the like. Hence, a sharp peak is formed in the chart as shown in FIG. 11, which shows the detected amount of boron over time. This further facilitates determining the endpoint of dry etching. The effect of this embodiment other than the foregoing is the same as that of the above first embodiment.

Also in this embodiment, the detection element infiltrated into the inner wall and the like of the reaction chamber 11 is not limited to boron, but can be any element which is not contained in the structure film and does not interfere with the processing step. For instance, such elements as phosphorus (P) and arsenic (As) can be used. Furthermore, also in this embodiment, like the variation of the first embodiment described above, the time to terminate dry etching can be determined by considering the temperature of the inner wall of the reaction chamber as well.

The invention has been described with reference to the embodiments. However, the invention is not limited to these embodiments. For instance, the above embodiments can be practiced in combination with each other. Furthermore, those skilled in the art can suitably modify the above embodiments by addition, deletion, or design change of components, or by addition, omission, or condition change of processes, and such modifications are also encompassed within the scope of the invention as long as they fall within the spirit of the invention.

The invention claimed is:

1. A semiconductor device manufacturing method for forming a structure film on a substrate in a reaction chamber, the method comprising:
   depositing a precoat film on an inner wall of the reaction chamber, the precoat film containing a detection element which is not contained in the structure film;
   forming the structure film on the substrate; and
   performing dry etching of the inner wall of the reaction chamber,
   the dry etching being terminated after the detection element is detected in a gas exhausted from the reaction chamber.

2. The method according to claim 1, wherein the dry etching is terminated after detected amount of the detection element has passed a peak and decreased.

3. The method according to claim 1, wherein
   the inner wall of the reaction chamber is formed from quartz,
   the structure film is a film containing silicon, and
   the detection element is boron.

4. The method according to claim 1, wherein an endpoint of the dry etching is determined by considering temperature of the inner wall as well.

5. A semiconductor device manufacturing method for forming a structure film on a substrate in a reaction chamber, the method comprising:
   depositing a precoat film on an inner wall of the reaction chamber, the precoat film containing an element contained in the structure film and having a different etching rate from the structure film;
   forming the structure film on the substrate; and
   performing dry etching of the inner wall of the reaction chamber, the dry etching being terminated after detected amount of the element contained in a gas exhausted from the reaction chamber is varied from the detected amount corresponding to the structure film.

6. The method according to claim 5, wherein the precoat film has a less film density than the structure film.

7. The method according to claim 5, wherein an endpoint of the dry etching is determined by considering temperature of the inner wall as well.

8. A semiconductor device manufacturing method for forming a structure film on a substrate in a reaction chamber, the method comprising:

forming the structure film on the substrate; and performing dry etching of the inner wall of the reaction chamber, the inner wall of the reaction chamber containing a detection element which is not contained in the structure film, and the dry etching being terminated after the detection element is detected in a gas exhausted from the reaction chamber.

9. The semiconductor device manufacturing method according to claim 8, further comprising:

filling the reaction chamber with a gas containing the detection element before the forming the structure film.

10. The method according to claim 8, wherein an endpoint of the dry etching is determined by considering temperature of the inner wall as well.

\* \* \* \* \*